(12) United States Patent
Dausch et al.

(10) Patent No.: US 8,692,441 B2
(45) Date of Patent: Apr. 8, 2014

(54) METHOD FOR FORMING AN ULTRASONIC TRANSDUCER, AND ASSOCIATED APPARATUS

(71) Applicant: Research Triangle Institute, Research Triangle Park, NC (US)

(72) Inventors: David Dausch, Raleigh, NC (US); Scott H. Goodwin, Hillsborough, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 0 days.

(21) Appl. No.: 13/907,046

(22) Filed: May 31, 2013

(65) Prior Publication Data

US 2013/0270967 A1 Oct. 17, 2013

Related U.S. Application Data

(63) Continuation of application No. PCT/US2011/062577, filed on Nov. 30, 2011.

(60) Provisional application No. 61/419,552, filed on Dec. 3, 2010.

(51) Int. Cl.
| | |
|---|---|
| *H01L 41/047* | (2006.01) |
| *H01L 41/053* | (2006.01) |
| *H01L 41/107* | (2006.01) |
| *H03H 9/15* | (2006.01) |
| *B31D 3/00* | (2006.01) |

(52) U.S. Cl.
USPC ........... 310/334; 310/324; 310/348; 310/365; 216/56

(58) Field of Classification Search
USPC ................. 310/324, 334, 348, 365; 29/25.35; 216/56
See application file for complete search history.

(56) References Cited

U.S. PATENT DOCUMENTS

| | | | |
|---|---|---|---|
| 7,161,283 B1 * | 1/2007 | Geefay .......................... | 310/348 |
| 7,728,487 B2 * | 6/2010 | Adachi et al. ................. | 310/322 |
| 8,357,981 B2 * | 1/2013 | Martin et al. ................. | 257/415 |
| 2002/0105250 A1 | 8/2002 | Klee et al. | |
| 2010/0201222 A1 * | 8/2010 | Adachi et al. ................. | 310/317 |
| 2010/0301703 A1 * | 12/2010 | Chen et al. .................... | 310/318 |
| 2012/0319535 A1 * | 12/2012 | Dausch ........................ | 310/365 |
| 2013/0155817 A1 * | 6/2013 | Kim ............................. | 367/189 |

FOREIGN PATENT DOCUMENTS

| | | | | |
|---|---|---|---|---|
| JP | 2011-49413 A | * | 3/2011 | ............. H01L 41/09 |
| WO | WO 2006/093913 | | 9/2006 | |
| WO | WO 2010/100861 | | 9/2010 | |

* cited by examiner

*Primary Examiner* — Thomas Dougherty
(74) *Attorney, Agent, or Firm* — Womble Carlyle Sandridge & Rice, LLP

(57) ABSTRACT

A method is provided for forming a piezoelectric ultrasonic transducer apparatus having a first electrode deposited on a dielectric layer disposed on a primary substrate. A piezoelectric material is deposited between the first electrode and a second electrode, to form a transducer device. At least the piezoelectric material is patterned such that a portion of the first electrode extends laterally outward therefrom. The primary substrate and the dielectric layer are etched to form a first via extending to the laterally outward portion of the first electrode, and a first conductive material is deposited to substantially fill the first via and form an electrically-conductive engagement with the laterally outward portion of the first electrode. The primary substrate is etched to define a second via extending therethrough, wherein the second via is laterally spaced apart from the first via. An associated method and apparatus are also provided.

40 Claims, 7 Drawing Sheets

METHOD FOR FORMING AN ULTRASONIC TRANSDUCER, AND ASSOCIATED APPARATUS

BACKGROUND OF THE DISCLOSURE

1. Field of the Disclosure

Figure 1A:
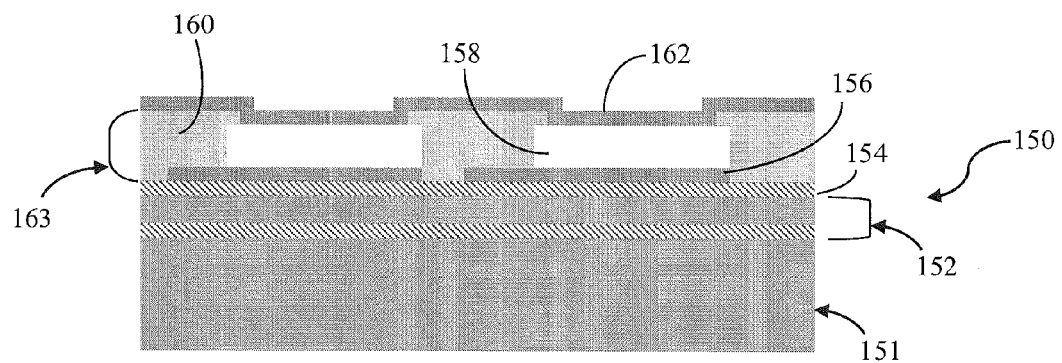

Aspects of the present disclosure relate to ultrasonic transducers, and, more particularly, to a method of forming a piezoelectric micromachined ultrasonic transducer defining an air-backed cavity, and an associated apparatus.

2. Description of Related Art

Some micromachined ultrasonic transducers (MUTs) may be configured, for example, as a piezoelectric micromachined ultrasonic transducer (pMUT) disclosed in U.S. Pat. No. 7,449,821 assigned to Research Triangle Institute, also the assignee of the present disclosure, which is also incorporated herein in its entirety by reference.

The formation of a pMUT device, such as the pMUT device defining an air-backed cavity as disclosed in U.S. Pat. No. 7,449,821, may involve the formation of an electrically-conductive connection between the first electrode (i.e., the bottom electrode) of the transducer device, wherein the first electrode is disposed on the front side of the substrate opposite to the air-backed cavity of the pMUT device, and the conformal metal layer(s) applied to the air-backed cavity for providing subsequent connectivity, for example, to an integrated circuit ("IC") or a flex cable. In this regard, some prior art methods involve, for example, deposition of a conformal metal layer in the air-backed cavity of the pMUT in direct contact with the first/bottom electrode (see, e.g., FIG. 7A of U.S. Pat. No. 7,449,821). In another example, the conformal metal layer is deposited in a via formed in a dielectric film to expose the first/bottom electrode (see, e.g., FIG. 7B of U.S. Pat. No. 7,449,821). In yet another example, involving a silicon-on-insulator (SOI) substrate, the conformal metal layer is deposited in a via extending to immediately adjacent the transducer device (see, e.g., FIGS. 14 and 15 of U.S. Pat. No. 7,449,821). However, such approaches may be limiting for high frequency transducer arrays having smaller dimensions.

High frequency transducers may be used for high resolution ultrasound imaging, for example, imaging with a resolution of approximately 100 μm, by operating the transducer within a frequency range of 20 MHz to 50 MHz. Transducers operating at standard imaging frequencies of, for instance, less than 10 MHz, typically have resolution of greater than 1 mm. The operating frequency for pMUT transducers may be inversely proportional to the width of the transducer element. As such, relatively smaller pMUT transducers can generally be operated at higher frequencies and, therefore, may provide a relatively better resolution. Further, in instances of steerable phased arrays, the transducer element pitch must be less than one wavelength in order to prevent grating lobe artifacts in the resulting images produced from the transducer signal. Generally, the ultrasound wavelength in bodily tissue is about 75 μm for a frequency of about 20 MHz and about 30 μm for a frequency of about 50 MHz. Therefore, it may be desirable for some transducer devices to include a transducer element having a lateral dimension (i.e., width) on the order of about 40 μm for about 20 MHz operation, or on the order of about 20 μm for operation at ultrasound frequencies of about 40-50 MHz. In such instances, however, the disclosed prior art configurations may result in an aspect ratio between the thickness of the substrate (i.e., about 400 μm) and the width of the via extending through the substrate to the transducer element of between about 10:1 and about 20:1. Such a configuration may not be desirable for forming though-wafer interconnects in line with the transducer elements (i.e., through the pMUT air-backed cavity).

Another aspect of some prior art methods is that the element forming the electrically-conductive connection between the first electrode and the conformal metal layer may be formed about one of the lateral edges of the pMUT device (see, for example, FIG. 15 of U.S. Pat. No. 7,449,821). In such instances, mechanical flexure of the actuated pMUT device may initiate or accelerate fatigue of the engagement between the electrically-conductive connection element and conformal conductive layer within the air-backed cavity of the pMUT device (otherwise referred to herein as the "second via"), for instance, due to stress concentrations about the sidewall/endwall edge of the second via. Such fatigue could result in cracking or delamination of the metal layer and failure of the electrically-conductive engagement therebetween and would thus create an open circuit condition between the first/bottom electrode of the pMUT device and the IC, flex cable or redistribution substrate engaged therewith, or may adversely affect the acoustic signals generated by the pMUT device.

Further, having a different material (i.e., a metal) disposed about a lateral edge of the membrane of the pMUT device for providing the electrical connection could change the boundary condition for membrane flexing and thus affect the frequency and/or vibrational mode (i.e., the fundamental or harmonic mode) of the pMUT device. Such a configuration may particularly adversely affect smaller membranes required for high frequency operation. Applying a conformal metal layer deposition, for example, of about 2 μm in thickness to a membrane of about 20 μm in width and about 8 μm in thickness may reduce the effective free membrane width by about 20% and increase the membrane thickness by about 25%. Such a configuration, as a result, may increase the resonance frequency, but could also undesirably reduce the acoustic output due to increased stiffness of the vibrating membrane resulting from the reduced free width and increased thickness thereof.

Thus, there exists a need in the ultrasonic transducer art, particularly with respect to a piezoelectric micromachined ultrasound transducer ("pMUT") having an air-backed cavity, for improved methods of forming an electrically-conductive connection between the first electrode (i.e., the bottom electrode) of the transducer device and the conductive member extending from the back side of the substrate to the first electrode so as to provide subsequent connectivity, for example, to an integrated circuit ("IC") or a flex cable.

BRIEF SUMMARY OF THE DISCLOSURE

The above and other needs are met by aspects of the present disclosure, wherein one such aspect relates to a method of forming a piezoelectric ultrasonic transducer apparatus. Such a method comprises depositing a first electrode on a dielectric layer disposed on a primary substrate. A piezoelectric material is deposited on the first electrode, and a second electrode is deposited on the piezoelectric material, so as to form a transducer device. At least the piezoelectric material is patterned such that a portion of the first electrode extends laterally outward therefrom. The primary substrate and the dielectric layer are etched to form a first via extending to the laterally outward extending portion of the first electrode. A first conductive material is deposited to substantially fill the first via, wherein the first conductive material forms an electrically-conductive engagement with the laterally outward extending portion of the first electrode. The primary substrate is etched to define a second via extending therethrough, and forming the air-backed cavity of the pMUT device, wherein the second via is laterally spaced apart from the first via. The air-backed cavity of the pMUT device associated with the piezoelectric element thus facilitates flexure and/or vibration of the pMUT membrane when voltage is applied to the piezoelectric material through the first and second electrodes, or when an acoustic echo is received by or otherwise acts on the pMUT membrane. Such a configuration thus facilitates transmission and reception of acoustic signals by the pMUT device.

Another aspect of the present disclosure provides a method of forming a piezoelectric ultrasonic transducer apparatus. Such a method comprises depositing a dielectric layer on a primary substrate, and then etching the primary substrate and the dielectric layer to form a first via extending therethrough. A first conductive material is deposited to substantially fill the first via. A first electrode is deposited on the dielectric layer disposed on the primary substrate such that the first electrode forms an electrically-conductive engagement with the first conductive material. A piezoelectric material is deposited on the first electrode, and a second electrode is deposited on the piezoelectric material, wherein the first and second electrodes cooperate with the piezoelectric material to form a transducer device. At least the piezoelectric material is patterned such that a portion of the first electrode extends laterally outward therefrom, wherein the laterally outward extending portion of the first electrode forms the electrically-conductive engagement with the first conductive material. The primary substrate is then etched to define a second via extending therethrough, wherein the second via is laterally spaced apart from the first via.

Yet another aspect of the present disclosure provides a piezoelectric ultrasonic transducer apparatus, comprising a transducer device disposed on a dielectric layer. The transducer device includes a first electrode disposed on the dielectric layer and a piezoelectric material disposed between the first electrode and a second electrode. The first electrode is configured to have a portion thereof extending laterally outward from at least the piezoelectric material. A primary substrate has the dielectric layer disposed thereon, and cooperates with the dielectric layer to define a first via extending to the laterally outward extending portion of the first electrode. The primary substrate further defines a second via extending therethrough, wherein the second via is laterally spaced apart from the first via. A first conductive material is configured to substantially fill the first via and to form an electrically-conductive engagement with the laterally outward extending portion of the first electrode.

Aspects of the present disclosure thus address the identified needs and provide other advantages as otherwise detailed herein.

BRIEF DESCRIPTION OF THE SEVERAL VIEWS OF THE DRAWING(S)

Figure 8:
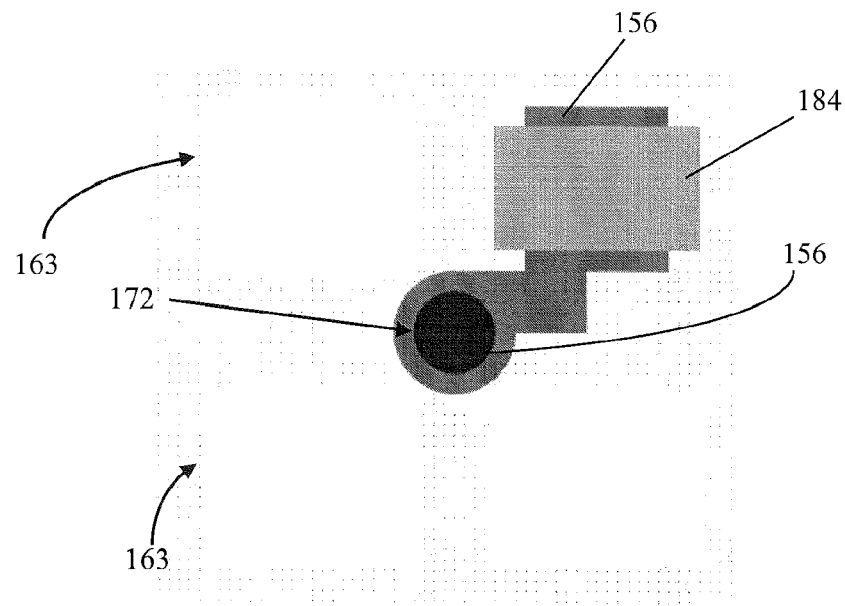
Figure 9A:
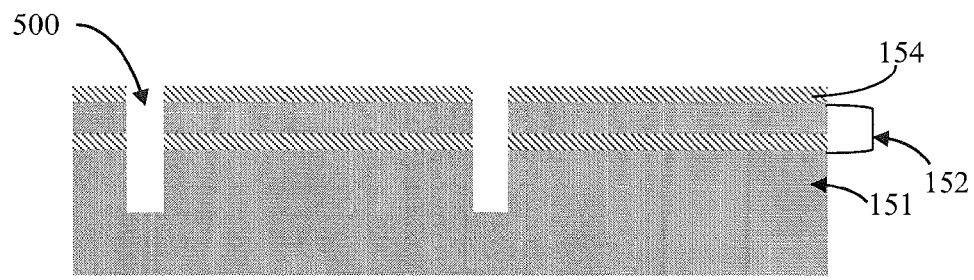
Figure 9B:
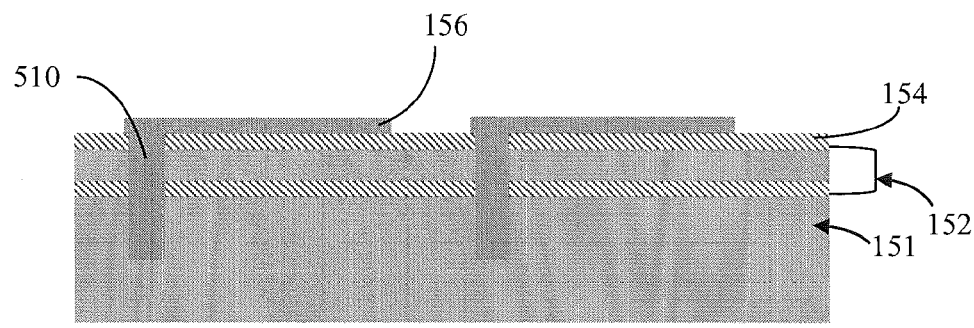
Figure 9C:
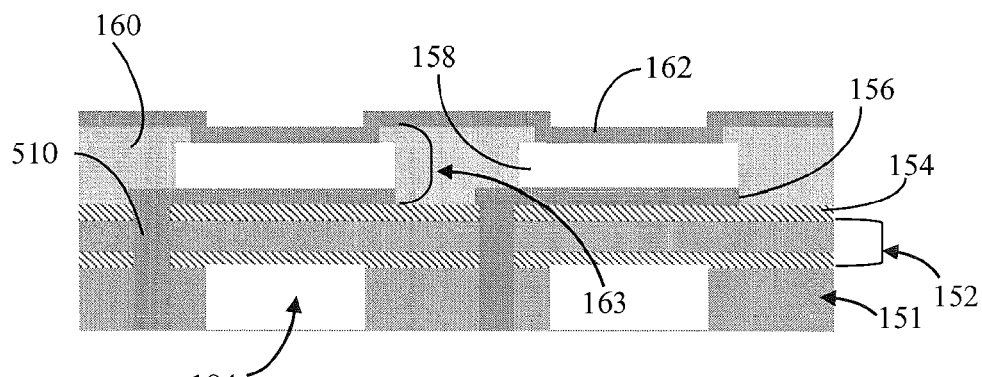
Figure 10A:
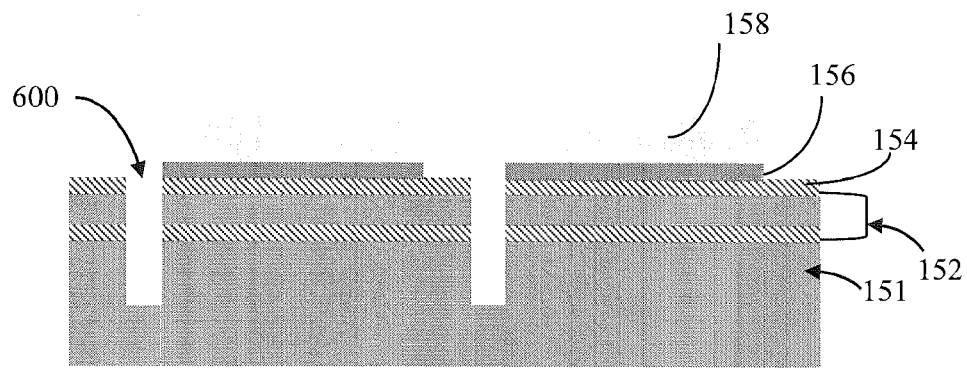
Figure 10B:
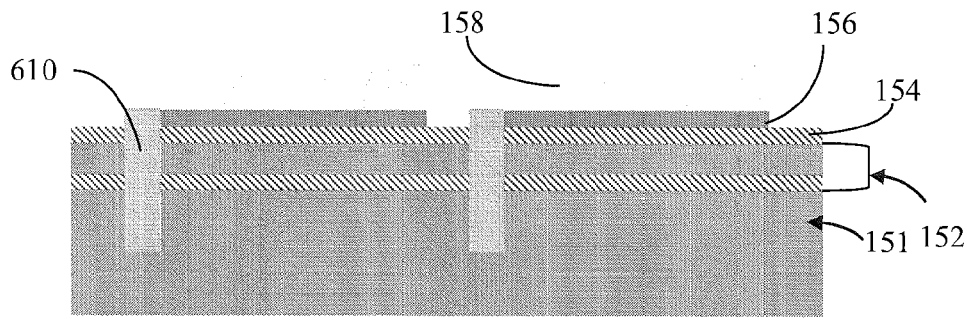
Figure 10C:
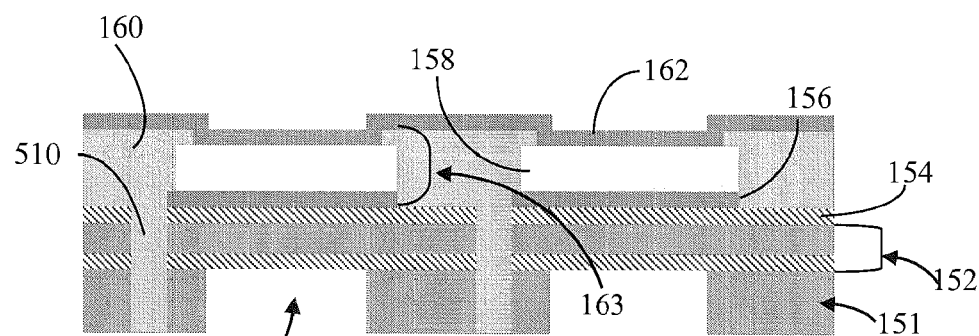
Figure 7:
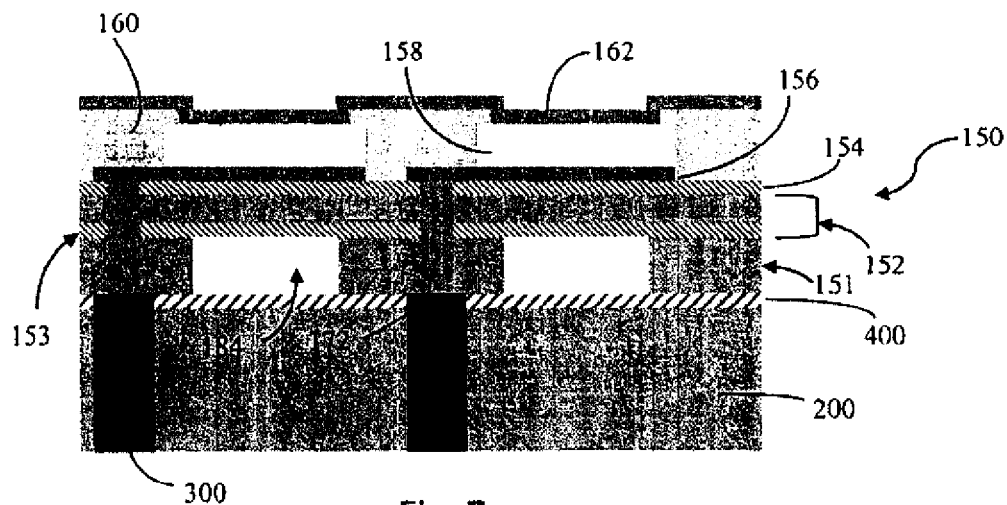
Figure 8:
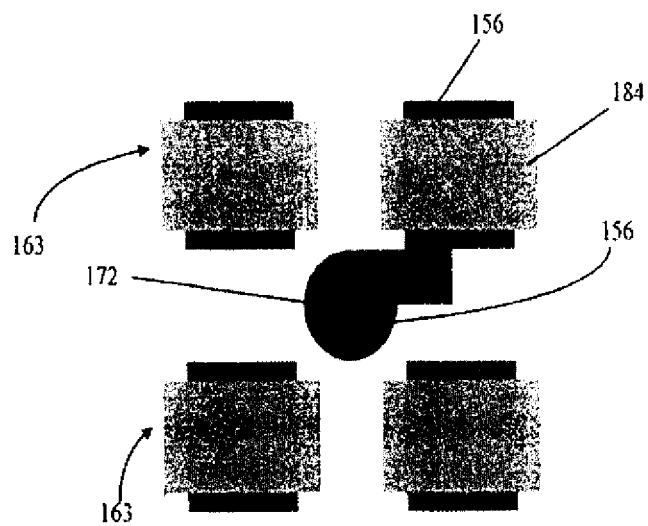

Having thus described the disclosure in general terms, reference will now be made to the accompanying drawings, which are not necessarily drawn to scale, and wherein:

FIGS. 1A, 1B, 2-5, 6A, 6B, and 7 schematically illustrate a method of forming a piezoelectric micromachined ultrasonic transducer apparatus, according to one aspect of the disclosure;

FIG. 8 is a partial schematic plan view of a piezoelectric micromachined ultrasonic transducer apparatus, according to one aspect of the disclosure;

FIGS. 9A-9C schematically illustrate a method of forming a piezoelectric micromachined ultrasonic transducer apparatus, according to another aspect of the disclosure; and FIGS. 10A-10C schematically illustrate a method of forming a piezoelectric micromachined ultrasonic transducer apparatus, according to yet another aspect of the disclosure.

DETAILED DESCRIPTION OF THE DISCLOSURE

The present disclosure now will be described more fully hereinafter with reference to the accompanying drawings, in which some, but not all aspects of the disclosure are shown. Indeed, the disclosure may be embodied in many different forms and should not be construed as limited to the aspects set forth herein; rather, these aspects are provided so that this disclosure will satisfy applicable legal requirements. Like numbers refer to like elements throughout.

Aspects of the present disclosure are generally directed to methods for forming an electrically-conductive member extending through a substrate to a transducer device supported thereby, and into electrically-conductive contact with the first/bottom electrode of the transducer device formed on the opposing surface of the substrate. More particularly, the first/bottom electrode layer is configured to extend laterally outward of the transducer device, such that the electrically-conductive member formed in electrically-conductive engagement with the first/bottom electrode layer is laterally displaced with respect to the transducer device. As such, the lateral displacement of the electrically conductive engagement from the air-backed cavity of the transducer device allows the electrically-conductive member to be formed with a more desirable aspect ratio, may provide an improved electrically-conductive engagement between the first/bottom electrode and the back side of the substrate, and may also reduce mechanical loading and resonant frequency attenuation of the transducer device.

Figure 2:
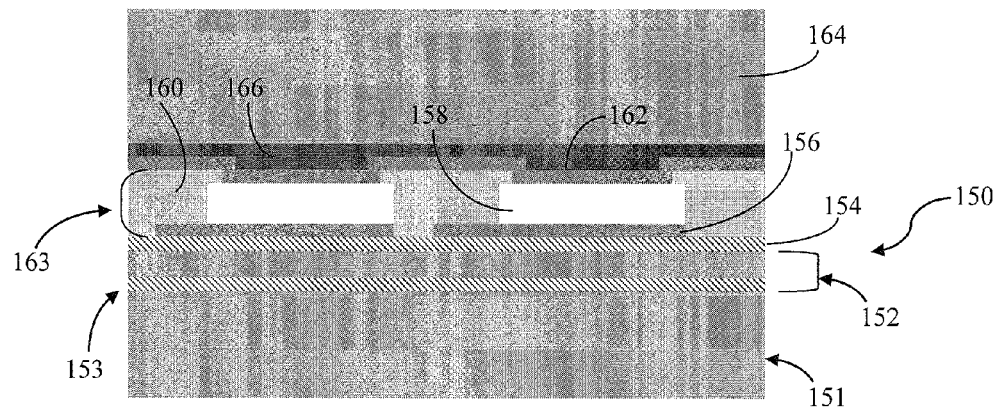

According to one aspect of the present disclosure, a method is provided for fabricating particular layers of one or more exemplary pMUT devices. One such example of a plurality of pMUT devices 150 (i.e., a pMUT "wafer") is shown FIG. 1A. Such a method may initially involve a primary substrate 151 having a silicon-on-insulator (SOI) device substrate 152 formed thereon, wherein the device substrate 152 includes a buried oxide layer 153 (FIG. 2). In other instances (not shown), the device substrate 152 may comprise silicon. An SOI substrate, if implemented, may provide a device (i.e., silicon) layer configured to function as a mechanical element capable of controlling, for example, the resonance frequency of the pMUT device. The SOI substrate may also be configured to provide a buried oxide layer, which may be implemented as an etch stop when etching the primary (handle) substrate to form the pMUT membrane. The device layer may be configured to have a thickness suitable for providing an appropriate stiffness of the membrane to produce the desired resonance frequency and acoustic output. For example, a pMUT membrane having a width of between about 70 μm and about 100 μm may operate optimally at a frequency of between about 7 MHz and about 12 MHz, with the device layer having a thickness of between about 5 μm and about 10 μm. In general, increasing the device layer thickness to about 15 μm increases the stiffness and damping of the pMUT membrane, which reduces acoustic output. In other aspects, a single silicon wafer can be used as the primary substrate, with the pMUT device being formed on the primary substrate. In such instances, the device layer and etch stop could be formed by heavily doping the silicon substrate to an appropriate depth, since doped silicon may be etched relatively slower than bulk silicon. The doped silicon thus functions as an etch stop for facilitating the provision of a mechanical layer thickness for producing the desired resonance frequency.

In some instances, a dielectric material such as, for example, a thermal $SiO_2$ (thermal oxide) dielectric layer 154 may be deposited on the device substrate 152. A first electrode layer 156 (otherwise referred to herein as a "bottom" electrode) comprising, for instance, a Ti/Pt material, may then be deposited on the dielectric layer 154, and the first electrode layer 156 is then configured to form the footprints of the transducer devices. A piezoelectric material layer 158 such as, for example, a piezoelectric (PZT) film, is subsequently deposited on the first electrode layer 156. In accordance with aspects of the present disclosure, the piezoelectric material layer 158 is deposited, or post-deposition patterned or otherwise configured, such that a portion of the first electrode layer 156 extends laterally outward or beyond the piezoelectric material layer 158 of each transducer device. In some instances, the laterally-outward extending portion of the first electrode layer 156 laterally extends from the interface with the piezoelectric material layer 158 of that transducer device to an interstice between adjacent transducer devices 163, as shown, for example, in FIG. 8. That is, in one instance, the piezoelectric material layer 158 may be deposited or patterned such that a portion of the first electrode layer 156 extends laterally outward therefrom to an interstice between four adjacent transducer devices 163 in a regularly-spaced array of transducer devices. In other instances, an irregular array spacing, or an array with varying element pitch (e.g., vertical pitch and horizontal pitch are different), may not provide suitable space for placement of the laterally-outward extending portion of the first electrode 156. In such instances, the laterally-outward extending portion of the first electrode 156 may be positioned either laterally or longitudinally between adjacent pairs of transducer devices 163 (such transducer devices 163 being shown, e.g., in FIGS. 1A, 1B, and 2) or in other arrangements where spacing permits in an irregularly patterned array of transducer devices.

An interlayer dielectric 160 such as, for instance a benzocyclobutene (BCB), polyimide, or parylene material, is then deposited and processed to separate the transducer devices 163 and to cover the laterally-outward extending portion of the first electrode layer 156. The interlayer dielectric 160 is patterned, for example, by photolithography and/or etching to expose a surface of the piezoelectric layer 158. A second electrode layer 162 (otherwise referred to herein as a "top" electrode) comprising, for instance, a Ti/Au material, is then deposited on the piezoelectric material layer 158 and the interlayer dielectric 160, such that the second electrode 162 is in electrical engagement/contact with the exposed surface of the piezoelectric layer 158. The first electrode layer 156, the piezoelectric material layer 158, and the second electrode layer 162 thus cooperate to form the transducer device 163 (see, e.g., FIGS. 1 and 2), such as, for example, a piezoelectric ultrasonic transducer. In some aspects, the second electrode layer 162 may comprise a ground electrode, while the first electrode layer 156 may comprise a signal electrode, of the transducer device 163. For an array of transducer devices, the signal electrodes fondled in the first electrode layer 156 are separated such that the signal electrodes for individual array elements are electrically isolated from each other. However, two or more of the transducer devices in the array may share a common ground electrode formed in the second electrode layer 162.

Piezoelectric materials that can be implemented in the piezoelectric material layer 158 include, for example, ceramics including ZnO, AlN, $LiNbO_4$, lead antimony stannate, lead magnesium tantalate, lead nickel tantalate, titanates, tungstates, zirconates, or niobates of lead, barium, bismuth, or strontium, including lead zirconate titanate ($Pb(Zr_xTi_{1-x})O_3$ (PZT)), lead lanthanum zirconate titanate (PLZT), lead niobium zirconate titanate (PNZT), $BaTiO_3$, $SrTiO_3$, lead magnesium niobate, lead nickel niobate, lead manganese niobate, lead zinc niobate, lead titanate. For the above inorganic oxide-type piezoelectric materials, a high temperature anneal must be completed to crystallize the material. For example, for PZT, annealing at 700° C. must be used to form the perovskite (piezoelectric) phase of the PZT material in order to obtain relatively good piezoelectric properties. Other lower temperature materials can also be used, such as piezoelectric polymer materials, including polyvinylidene fluoride (PVDF), polyvinylidene fluoride-trifluoroethylene (PVDF-TrFE), or polyvinylidene fluoride-tetrafluoroethylene (PVDF-TFE), which do not require the high temperature anneal or otherwise may require only a moderate anneal (<300° C.).

Figure 1B:
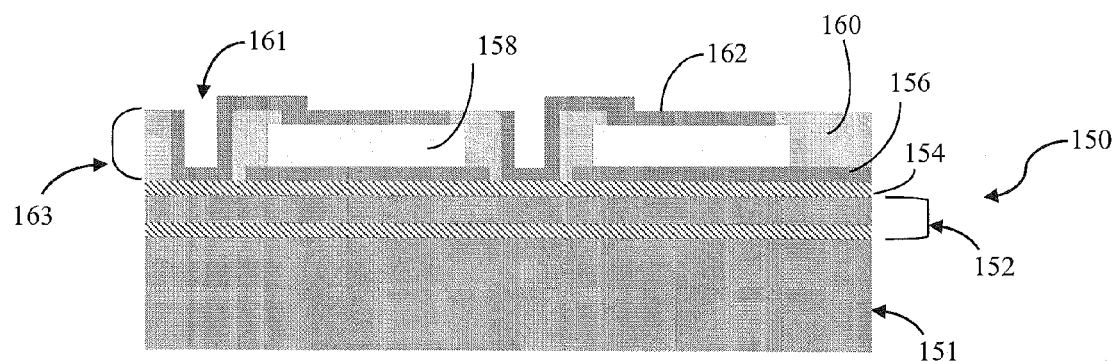

An alternate aspect is shown in FIG. 1B. In such an aspect, the second electrode layer 162 may be configured to form a separate signal electrode for each transducer device 163. More particularly, openings 161 may be formed in the interlayer dielectric 160, prior to deposition of the second electrode layer 162, for instance, using photolithography and/or by etching the interlayer dielectric 160. In some instances, the openings 161 may have sloped sidewalls to facilitate deposition of the second electrode layer 162 with adequate step coverage over the interlayer dielectric. In some aspects, the second electrode layer 162 may comprise a signal electrode, while the first electrode layer 156 may comprise a ground electrode, of the transducer device 163. For an array of transducer devices, the signal electrodes formed in the second electrode layer 162 may be separated such that the signal electrodes for individual transducer devices 163 in the array are electrically isolated from each other. However, the transducer devices 163 may share a common ground electrode formed in the first electrode layer 156. The first (ground) electrode may be a continuous layer covering the dielectric layer 154, but with openings corresponding to the openings 161 in the interlayer dielectric 160, such that the first (ground) and second (signal) electrodes are also electrically isolated from each other.

Figure 3:
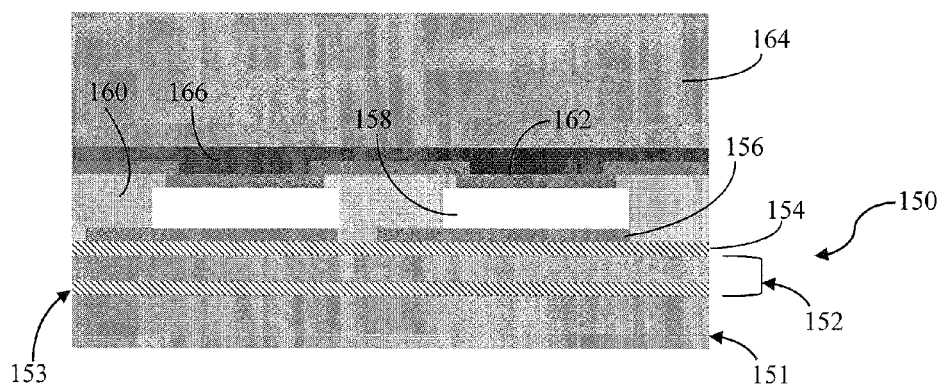

As shown in FIG. 2, in order to process the back side of the substrate, a carrier substrate 164 may be bonded to the top surface (i.e., the second electrode layer 162) of the pMUT wafer 150 using, for example, an epoxy, an adhesive tape, or other adhesive material 166 that can be removed in later processing. As shown in FIG. 3, the primary substrate 151 may then be thinned, for example, by back-grinding or chemical mechanical polishing (CMP), in order to achieve a desirable dimension (i.e., thickness) for desirable performance of the transducer device 163, according to aspects of the disclosure as further disclosed herein. One skilled in the art will appreciate that the partial removal of the primary substrate 151 can be accomplished in various manners. Thinning of the primary substrate 151 may provide a benefit by reducing the overall thickness of the pMUT device, such that the pMUT device may more readily fit within a relatively small diameter catheter, particularly when stacked or otherwise engaged with other devices such as IC's and/or interposers that may increase the overall thickness of the stack.

Figure 4:
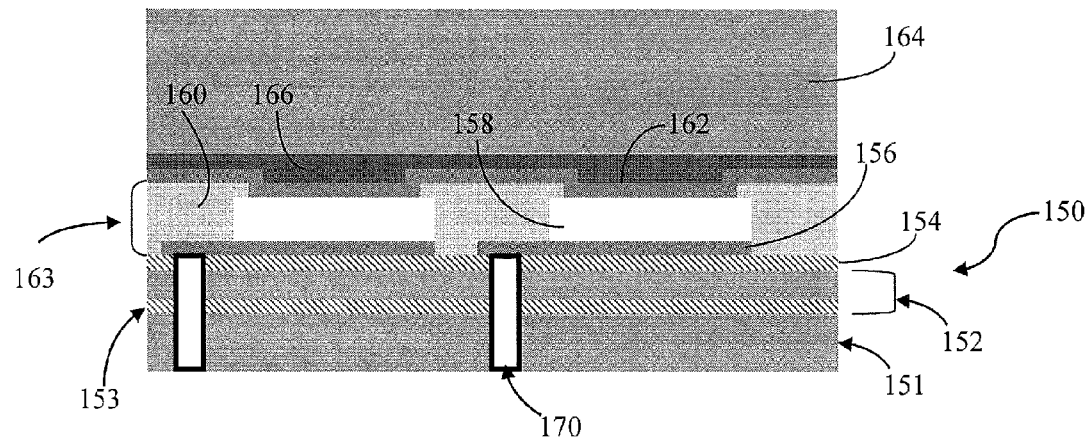

As shown in FIG. 4, first vias 170 may then be formed in the remaining portion of the primary substrate 151, for example, by etching using a deep reactive ion etching (DRIE) process (for substantially vertical sidewalls). In some instances, it may be preferred that the etch profile includes substantially vertical sidewalls so as to minimize the lateral extent of the via diameter, and thus maintain element pitch of less than one wavelength. In one aspect, first vias 170 may be formed in the remaining primary substrate 151 so as to extend through the device substrate 152 and the dielectric (thermal oxide) layer 154 to expose the laterally-outward extending portion of the first/bottom electrode layer 156 of the transducer device 163. In this manner, first vias 170 may be formed interstitially between adjacent pMUT devices 163. According to one particular aspect, thinning of the primary substrate 151, prior to formation of the first vias 170 may be arranged to provide a particular aspect ratio between the thickness of the primary substrate 151 and the width of the first via 170. The aspect ratio may be optimized for the subsequent conformal metal or conductive material layer(s), as well as the insulator (or insulating material) depositions and etches, to facilitate conformality of the particular deposition and also to facilitate removal of the insulator (or insulating material) from an end wall (i.e., bottom surface) of a via, without substantially affecting the conformal insulating material deposited on the sidewall. Such characteristics may thus facilitate electrically-conductive engagement between the conformal metal or conductive material layer and the first electrode layer 156, while substantially preserving the insulator/insulating material deposited on the sidewall of the via, so as to electrically insulate the primary substrate and/or device layer or substrate from the subsequently deposited conformal metal or conductive material layer.

In one instance, deposition and etching techniques may be configured such that the aspect ratio between the thickness of the primary substrate 151 and the width of the first via 170 may be in the range of between about 1:1 and about 20:1, wherein such a range may facilitate conformality of the conformal metal or conductive material layer(s), as well as the insulator/insulating material layer(s), electrically conductive engagement between the conformal metal/conductive material layer and the first (bottom) electrode layer 156, and/or substantial preservation of the conformal insulator/insulating material layer on the sidewall of the via (while facilitating removal of the insulator/insulating material layer from the end wall of the via). In one aspect, it may be preferable for the aspect ratio to be between about 5:1 and about 7:1. In an exemplary aspect, the aspect ratio of the thickness of the primary substrate 151 to the width of the first via 170 may be about 6:1. For example, in instances of a pMUT device configured for about 20 MHz operation, the first via 170 may have a lateral dimension (i.e., width) of about 12 μm, and it may be desirable for the primary substrate 151 to have a depth (i.e., thickness) of about 80 μm. In such instances, the electrically-conductive engagement with the first/bottom electrode 156 through the first via 170 may have an ohmic resistance on the order of about 50 milliohms, when the first via 170 is filled with a conductive material such as a metal. In another example, in instances of a pMUT device configured for about 40 MHz operation, the first via 170 may have a lateral dimension (i.e., width) of about 6 μm, and it may be desirable for the primary substrate 151 to have a depth (i.e., thickness) of about 40 μm. In such instances, the electrically-conductive engagement with the first/bottom electrode 156 through the first via 170 may have an ohmic resistance on the order of about 100 milliohms, when the first via 170 is filled with a conductive material such as a metal. In configurations involving a thinned primary substrate 151, particular processing steps subsequent to the thinning process may be accomplished with the carrier substrate 164 remaining engaged the top surface of the pMUT wafer 150.

Once the first vias 170 are formed, the primary substrate 151, including the first vias 170 formed therein, can then have deposited thereon a conformal insulator material (not shown), in some instances, with the conformal insulator layer extending into the first via 170 to the dielectric layer 154. The conformal insulator material may comprise, for example, an insulating polymer or a silicon oxide layer, such as parylene or TEOS $SiO_2$, to electrically isolate the primary substrate 151 defining the first vias 170. That is, the primary substrate 151 may have deposited thereon the conformal insulator material which extends about the exposed surfaces of the primary substrate 151 and into the first vias 170 so as to cover the "sidewalls" of the first vias 170. In so being deposited in the first vias 170 and covering the sidewalls thereof, the conformal insulator material may also be engaged with the dielectric (thermal oxide) layer 154 and the device substrate 152, also defining the first via 170.

Figure 5:
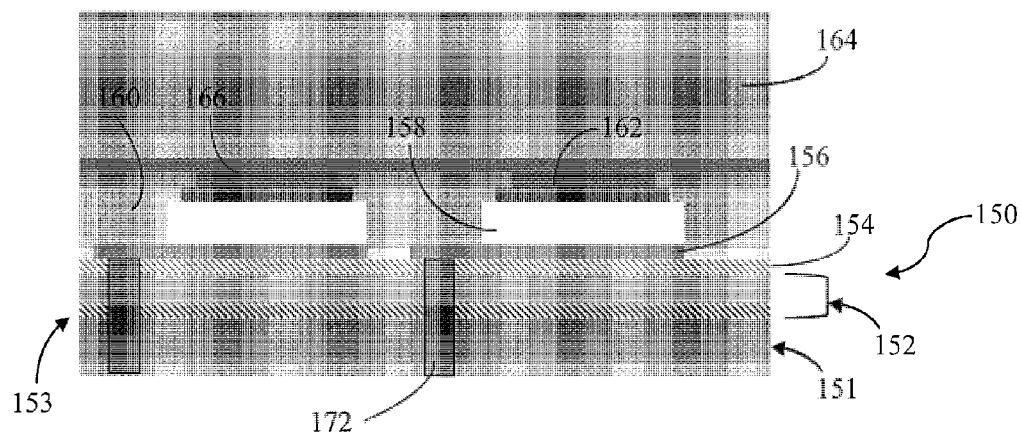

As shown in FIG. 5, the first vias 170 can then be filled with a first conductive material 172 (i.e., by deposition of a layer of metal or other conductive material) such as for example, Cu, in a sputtering, chemical vapor deposition, and/or plating process. The first conductive material 172 is configured to substantially fill the first via 170 and to form an electrically-conductive engagement with the laterally-outward extending portion of the first/bottom electrode layer 156. In other aspects, the conductive material 172 may be configured to be deposited only on the sidewall of the first via 170, without substantially filling the first via 170. Of course, in order to form the electrically-conductive engagement, one skilled in the art will appreciate that appropriate measures may be implemented to ascertain that the conformal insulator material is not deposited on the first/bottom electrode layer 156 within the first via 170, or that the conformal insulator layer deposited on the first/bottom electrode layer 156 within the first via 170 is removed prior to deposition of the first conductive material 172. The first conductive material 172 may thus provide an electrically-conductive element extending from the first/bottom electrode layer 156 through the dielectric (thermal oxide) layer 154, the device substrate 152, and the remaining primary substrate 151, to the back side of the substrate.

A second conductive material (not shown) comprising for example, a metal such as Ti/Cu, may then be patterned or otherwise formed on the back side of the primary substrate 151 using, for example, a sputtering or ion milling process. In this regard, the second conductive material may be configured to form an electrically-conductive engagement directly with the exposed portion of the first conductive material 172 extending through the remaining primary substrate 151 from the first via 170.

Figure 6A:
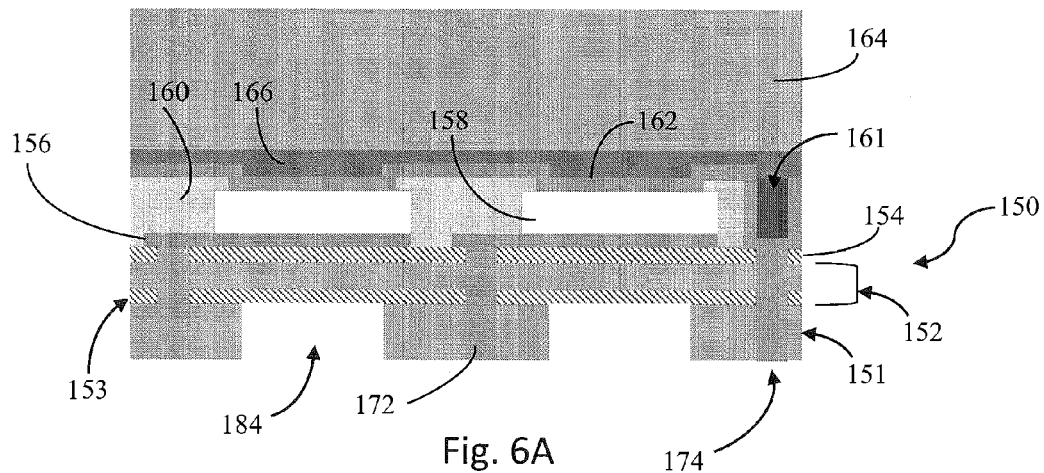
Figure 6B:
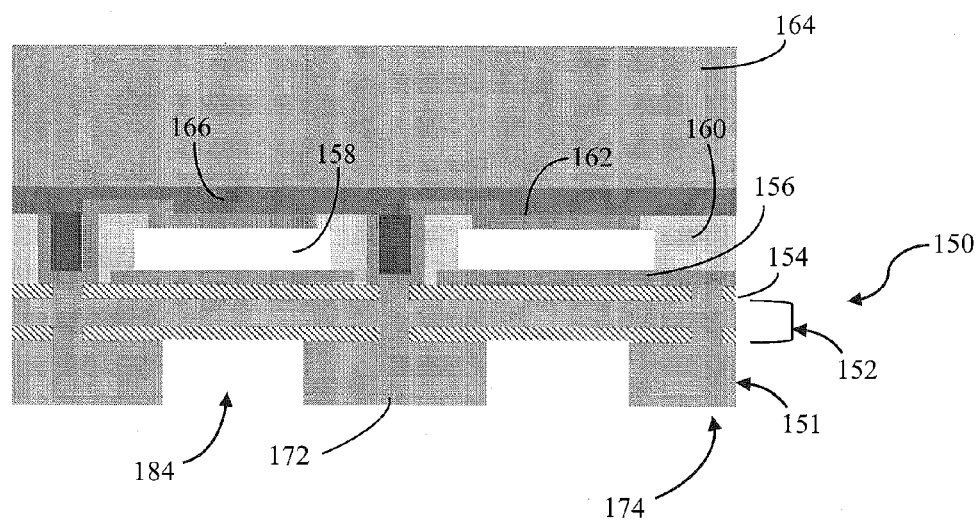

As shown in FIG. 6A, second vias 184 may then be formed in the primary substrate 151 from the back side thereof, for example, using an appropriate etching process (i.e., DRIE). The second vias 184 may be formed so as to extend through the primary substrate 151 (and any portion of the conformal insulator material disposed on the back side thereof) to expose the buried oxide layer 153 of the device substrate 152, with the exposed buried oxide layer 153 thereby forming an end wall of the second via 184. The second vias 184 may be laterally spaced apart from the first vias 170. In one instance, each second via 184 may extend toward the transducer device 163/piezoelectric material layer 158, and not toward the laterally-outward extending portion of the first/bottom electrode layer 156, which results in the second via 184 being laterally spaced apart from the corresponding first via 170. In order to connect the second (common ground) electrode layer 162 to the back side, openings 161 formed in the interlayer dielectric 160, as previously described, and having the second electrode layer 162 deposited therein may provide a contact area to the second electrode layer 162. More particularly, in conjunction with the openings 161, additional first vias 174 may be patterned so as to correspond to the openings 161, whereby the first conductive material 172 deposited in the additional first vias 174 may be configured to form an electrically-conductive engagement with the second (common ground) electrode layer 162.

Once the pMUT devices 150 are formed, for example, as previously disclosed, the pMUT devices 150, as shown in FIG. 6, may be operably engaged with an external device (i.e., element 200 in FIG. 7) such as, for example, an integrated circuit (e.g., a control IC such as amplifier or multiplexer), an interposer (e.g., silicon or flex cable), or redistribution element (see, e.g., FIG. 7), for example, using an appropriate bonding arrangement 400. In some instances, conductive solder elements (e.g., solder bumps), conductive stud elements, conductive bonding materials, or other suitable electrically-conductive connection provisions (not shown), may be implemented to provide an electrically-conductive engagement between the first conductive material 172 extending from the first electrode layer 156 of a particular pMUT device and corresponding conductive elements 300 of the IC, flex cable, redistribution element, or other external device 200. In this regard, an electrically-conductive engagement may be formed between the first conductive material 172 and an external device according to the methods and configurations described, for example, in U.S. Patent Application No. 61/329,258 ("Methods for Forming a Connection with a Micromachined Ultrasonic Transducer, and Associated Apparatuses"), assigned to Research Triangle Institute (also the assignee of the present disclosure), and which is incorporated herein in its entirety by reference.

The carrier substrate 164 may then be de-bonded or otherwise removed to expose the second electrode layer 162. In some instances, a conformal layer (not shown) comprising a polymeric material such as, for example, parylene or other suitable polymer, may be deposited on the second electrode layer 162 in order to provide, for instance, device protection and moisture barrier functions.

Such aspects of the disclosure may thus provide a direct electrically-conductive engagement between the back side of the primary substrate 151 and the first/bottom electrode layer 156, via the first conductive material 172 and the laterally-outward extending portion of the first/bottom electrode layer 156. That is, one aspect of the present disclosure is directed to a method involving formation of electrically-conductive (i.e., metal) "plugs" extending through a via, so as to provide a direct electrically-conductive engagement between the first/bottom electrode layer and the plug extending through the via. Direct metal to metal contact, such as direct contact between the first/bottom electrode layer and the plug, may thus advantageously provide a low-resistance electrically-conductive engagement as compared to a doped silicon layer. In particular aspects, the first/bottom electrode layer may be configured to extend laterally outward of the transducer device, such that the electrically-conductive member 172 formed within a first via 170, in electrically-conductive engagement with the first/bottom electrode 156, is laterally displaced with respect to the transducer device, in some instances, interstitially between adjacent pMUT devices. As such, the lateral displacement of the electrically conductive engagement from the air-backed cavity (second via 184) of the transducer device may also allow the electrically-conductive member 172 to be formed with a more desirable aspect ratio (i.e., the ratio between the thickness of the primary substrate 151 and the width of the first via 170), and may also reduce mechanical loading and resonant frequency attenuation of the transducer device (e.g., as compared to an electrically-conductive engagement established through the air-backed cavity of the pMUT device). Such aspects of the disclosure, in some instances, may also facilitate improved electrically-conductive engagement between the pMUT device via the first/bottom electrode layer 156, and an external device such as an interposer, IC, redistribution element, or other external device, via the direct electrically-conductive engagement path between the first conductive material and the first/bottom electrode 156. Such aspects may also be beneficial, in one particular instance, for ultrasonic transducer devices used in medical imaging applications.

The aspects disclosed above may be designated, for example, as a "Vias Last" arrangement/method for forming through-silicon vias (TSV's), or through-substrate vias, for providing an electrically conductive engagement configuration for both the signal and ground electrodes of the transducer device through one side (i.e., the back side) of the substrate. More particularly, access to the first and second electrode layers 156, 162 is provided through the primary substrate 151. Such an arrangement/method may facilitate the formation of the PZT transducer elements (i.e., the piezoelectric material layer 158), including a high temperature anneal of the piezoelectric material layer 158 at 700° C.), prior to forming the TSV's. Therefore, standard TSV materials (i.e., materials not required to withstand high annealing temperatures) can be implemented. For example, Cu metallization may be implemented for the first conductive material 172.

One skilled in the art, however, will appreciate that other arrangements and methods of forming such TSV's can also be implemented to produce similar structures for pMUT devices. Two particular examples of other TSV arrangements and methods are disclosed hereinafter.

In one exemplary aspect, it may be desirable, in some instances, to first form the TSV's in the primary substrate 151, prior to forming the pMUT transducer devices 163. Since the primary substrate 151 includes buried or otherwise preformed TSV's, prior to forming the pMUT devices 163, such an aspect may be designated, for example, as a "Vias First" arrangement/method. As shown in FIG. 9A, the first vias 500 may be etched in the primary substrate (and device substrate, if the primary substrate 151 is an SOI substrate). In such instances, the first vias 500 are "blind vias" etched to a depth corresponding to the final desired thickness of the primary substrate 151, as previously disclosed, for example, for relatively high frequency pMUT devices. In some aspects, a dielectric layer (not shown), such as silicon dioxide, may be deposited on the device substrate or the primary substrate 151, and in the first vias 500, in order to electrically isolate the substrate from subsequent layers.

Figure 7:
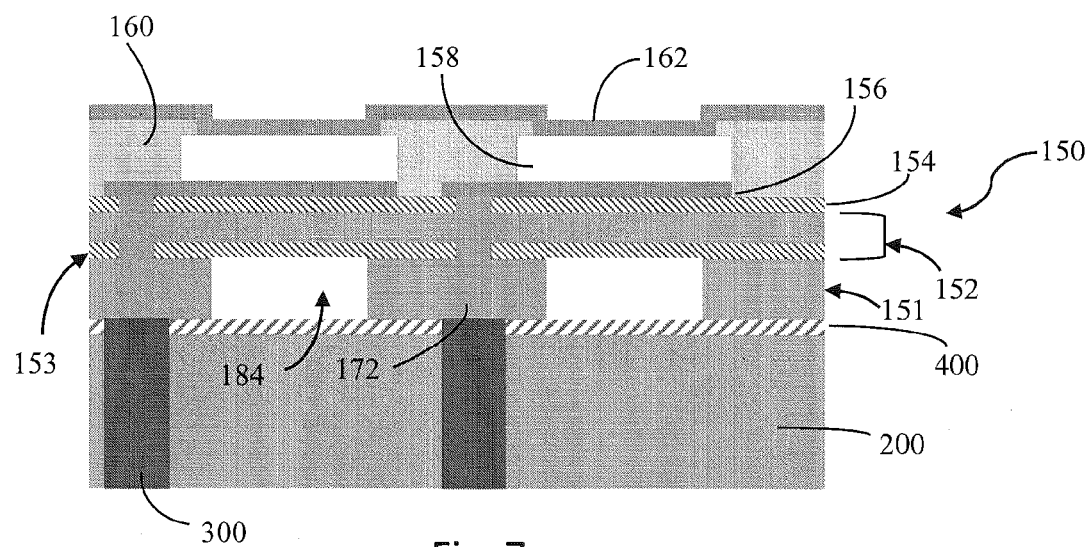

The first vias 500 are then substantially filled with a conductive material 510, as shown in FIG. 9B. In one instance, the conductive material 510 may be a relatively high temperature conductive material such as, for example, Ti, Pt or W, in order to withstand the annealing temperature of the subsequently deposited piezoelectric material layer 158, wherein such an annealing temperature may be about 700° C. for PZT. The conductive material 510 may be deposited, for example, by RF sputtering, chemical vapor deposition or electroplating. A first electrode 156 is then deposited on the dielectric layer 154 so as to form an electrically-conductive engagement with the conductive material 510 in the first vias 500. The remaining components of the pMUT device 163, namely, the piezoelectric material layer 158, the interlayer dielectric 160, and the second electrode layer 162 may then be deposited, as shown in FIG. 9C. A carrier substrate (not shown) may then be engaged with the piezoelectric device 163 and the primary substrate 151 thinned to expose the conductive material 510 in the first vias 500. The second vias 184 may then be etched to form the air-backed cavities associated with the pMUT devices 163. The completed device, as shown in FIG. 9C, can then be bonded to an external device, such as an IC, flex circuit, interposer, or redistribution element, as shown in FIG. 7.

In another aspect, it may be desirable, in some instances, to first form the TSV's in the primary substrate 151, after forming the piezoelectric elements/piezoelectric material layer 158, but prior to forming the remaining components of the pMUT device 163. Such an aspect may be designated, for example, as a "Vias Middle" arrangement/method. As shown in FIG. 10A, a first electrode layer 156 is deposited on the dielectric layer 154, followed by the piezoelectric material layer 158 deposited on the first electrode layer 156. These first electrode and piezoelectric material layers 156, 158 may then be patterned, for example, by photolithography, etching, and/or liftoff processing. The first vias 600 may then be etched in the primary substrate (and device substrate, if the primary substrate 151 is an SOI substrate). The first vias 600 may be formed adjacent to the patterned first electrode(s) in the first electrode layer 156, and are "blind vias" etched to a depth corresponding to the final desired thickness of the primary substrate 151, as previously disclosed, for example, for relatively high frequency pMUT devices. In some aspects, a dielectric layer (not shown), such as silicon dioxide, may be deposited on the device substrate or the primary substrate 151, and in the first vias 600, in order to electrically isolate the substrate from subsequent layers.

The first vias 600 are then substantially filled with a conductive material 610, as shown in FIG. 10B. In one instance, the conductive material 510 may be a relatively low temperature conductive material such as, for example, Cu (i.e., since the conductive material 610 is deposited following the high temperature annealing process). The conductive material may be deposited, for example, by RF sputtering, chemical vapor deposition, or electroplating. The remaining components of the pMUT device 163, including the interlayer dielectric 160 and the second electrode layer 162 may then be deposited, as shown in FIG. 10C. A carrier substrate (not shown) may then be engaged with the piezoelectric device 163 and the primary substrate 151 thinned to expose the conductive material 610 in the first vias 600. The second vias 184 may then be etched to form the air-backed cavities associated with the pMUT devices 163. The completed device, as shown in FIG. 10C, can then be bonded to an external device, such as an IC, flex circuit, interposer, or redistribution element, as shown in FIG. 7.

Many modifications and other aspects of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific aspects disclosed and that modifications and other aspects are intended to be included within the scope of the appended claims. Although specific terms are employed herein, they are used in a generic and descriptive sense only and not for purposes of limitation.

That which is claimed:

1. A method of forming a piezoelectric ultrasonic transducer apparatus, said method comprising:

depositing a first electrode on a dielectric layer disposed on a primary substrate;

depositing a piezoelectric material on the first electrode, and depositing a second electrode on the piezoelectric material, the first and second electrodes cooperating with the piezoelectric material to form a transducer device;

patterning at least the piezoelectric material such that a portion of the first electrode extends laterally outward therefrom;

etching the primary substrate and the dielectric layer to form a first via extending to the laterally outward extending portion of the first electrode;

depositing a first conductive material to substantially fill the first via, the first conductive material forming an electrically-conductive engagement with the laterally outward extending portion of the first electrode; and etching the primary substrate to define a second via extending therethrough, the second via being laterally spaced apart from the first via.

2. A method according to claim 1, wherein depositing a first electrode further comprises depositing a first electrode on the dielectric layer, the dielectric layer being disposed on a device substrate, and the device substrate further being disposed on the primary substrate.

3. A method according to claim 1, further comprising removing a portion of the primary substrate, prior to etching the primary substrate to form the first via, such that an aspect ratio of a thickness of the primary substrate to a width of the first via is between about 1:1 and about 20:1.

4. A method according to claim 3, wherein removing a portion of the primary substrate further comprises removing a portion of the primary substrate such that the aspect ratio is between about 5:1 and about 7:1.

5. A method according to claim 3, wherein removing a portion of the primary substrate further comprises removing a portion of the primary substrate such that the aspect ratio is about 6:1.

6. A method according to claim 1, further comprising depositing an insulating material on the primary substrate, the insulating material extending into and lining the first via, prior to depositing the first conductive material.

7. A method according to claim 6, wherein the first via is defined by a sidewall and an end wall, and the method further comprises etching the insulating material so as to substantially remove the insulating material from the end wall, without removing the insulating material from the sidewall.

8. A method according to claim 6, further comprising depositing a second conductive material on the insulating material on the primary substrate, the second conductive material forming an electrically-conductive engagement with the first conductive material.

9. A method according to claim 6, further comprising etching the insulating material disposed on the primary substrate, prior to etching the primary substrate to form the second via.

10. A method according to claim 1, wherein forming a transducer device further comprises forming a transducer device such that the first electrode is configured as a signal electrode, the second electrode is configured as a ground electrode, and the first and second electrodes are each comprised of an electrically-conductive material.

11. A method according to claim 1, further comprising forming an electrically-conductive engagement between the first conductive material and an external device with one of a conductive solder element, a conductive stud element, and a conductive bonding material therebetween.

12. A method according to claim 8, further comprising forming an electrically-conductive engagement between the second conductive material and an external device with one of a conductive solder element, a conductive stud element, and a conductive bonding material therebetween.

13. A method according to claim 1, wherein etching the primary substrate to define a second via further comprises etching the primary substrate to define a second via extending through the primary substrate toward the piezoelectric element.

14. A method of forming a piezoelectric ultrasonic transducer apparatus, said method comprising:
    depositing a dielectric layer on a primary substrate;
    etching the primary substrate and the dielectric layer to form a first via extending therethrough;
    depositing a first conductive material to substantially fill the first via;
    depositing a first electrode on the dielectric layer disposed on the primary substrate such that the first electrode forms an electrically-conductive engagement with the first conductive material;
    depositing a piezoelectric material on the first electrode, and depositing a second electrode on the piezoelectric material, the first and second electrodes cooperating with the piezoelectric material to faun a transducer device;
    patterning at least the piezoelectric material such that a portion of the first electrode extends laterally outward therefrom, the laterally outward extending portion of the first electrode forming the electrically-conductive engagement with the first conductive material; and
    etching the primary substrate to define a second via extending therethrough, the second via being laterally spaced apart from the first via.

15. A method according to claim 14, wherein depositing a dielectric layer further comprises depositing a dielectric layer on a device substrate, the device substrate further being disposed on the primary substrate, such that etching the primary substrate further comprises etching the primary substrate, the device substrate, and the dielectric layer to form a first via extending therethrough.

16. A method according to claim 14, wherein the first via is defined by a sidewall, and the method further comprises depositing an insulating material so as to line the sidewall of the first via prior to depositing the first conductive material.

17. A method according to claim 16, wherein depositing an insulating material further comprises depositing an insulating material so as to substantially cover the primary substrate.

18. A method according to claim 14, further comprising removing a portion of the primary substrate such that an aspect ratio of a thickness of the primary substrate to a width of the first via is between about 1:1 and about 20:1.

19. A method according to claim 18, wherein removing a portion of the primary substrate further comprises removing a portion of the primary substrate such that the aspect ratio is between about 5:1 and about 7:1.

20. A method according to claim 18, wherein removing a portion of the primary substrate further comprises removing a portion of the primary substrate such that the aspect ratio is about 6:1.

21. A method according to claim 17, further comprising depositing a second conductive material on the insulating material on the primary substrate, the second conductive material forming an electrically-conductive engagement with the first conductive material.

22. A method according to claim 17, further comprising etching the insulating material disposed on the primary substrate, prior to etching the primary substrate to form the second via.

23. A method according to claim 14, wherein forming a transducer device further comprises forming a transducer device such that the first electrode is configured as a signal electrode, the second electrode is configured as a ground electrode, and the first and second electrodes are each comprised of an electrically-conductive material.

24. A method according to claim 14, further comprising forming an electrically-conductive engagement between the first conductive material and an external device with one of a conductive solder element, a conductive stud element, and a conductive bonding material therebetween.

25. A method according to claim 21, further comprising forming an electrically-conductive engagement between the second conductive material and an external device with one of a conductive solder element, a conductive stud element, and a conductive bonding material therebetween.

26. A method according to claim 14, wherein etching the primary substrate to define a second via further comprises etching the primary substrate to define a second via extending through the primary substrate toward the piezoelectric element.

27. A piezoelectric ultrasonic transducer apparatus, comprising:
    a transducer device disposed on a dielectric layer, the transducer device including a first electrode disposed on the dielectric layer and a piezoelectric material disposed between the first electrode and a second electrode, the first electrode being configured to have a portion thereof extending laterally outward from at least the piezoelectric material;
    a primary substrate having the dielectric layer disposed thereon, the primary substrate cooperating with the dielectric layer to define a first via extending to the laterally outward extending portion of the first electrode, the primary substrate further defining a second via extending therethrough, the second via being laterally spaced apart from the first via; and
    a first conductive material configured to substantially fill the first via and to form an electrically-conductive engagement with the laterally outward extending portion of the first electrode.

28. An apparatus according to claim 27, further comprising a device substrate disposed between the dielectric layer and the primary substrate, the device substrate cooperating with the primary substrate and the dielectric layer to define the first via.

29. An apparatus according to claim 27, wherein the primary substrate comprises a silicon substrate.

30. An apparatus according to claim 28, wherein the primary substrate and the device substrate are configured to cooperate to define a silicon-on-insulator substrate.

31. An apparatus according to claim 27, wherein the primary substrate is configured to have an aspect ratio of a thickness of the primary substrate to a width of the first via of between about 1:1 and about 20:1.

32. An apparatus according to claim 31, wherein primary substrate is configured such that the aspect ratio is between about 5:1 and about 7:1.

33. An apparatus according to claim 31, wherein the primary substrate is configured such that the aspect ratio is about 6:1.

34. An apparatus according to claim 27, further comprising an insulating material deposited on the primary substrate, the insulating material extending into and lining the first via, and substantially exposing the first conductive material.

35. An apparatus according to claim 34, wherein the insulating material is further disposed between the primary substrate and the first conductive material within the first via.

36. An apparatus according to claim 34, further comprising a second conductive material deposited on the insulating material on the primary substrate, the second conductive material forming an electrically-conductive engagement with the first conductive material.

37. An apparatus according to claim 27, wherein the first electrode is configured as a signal electrode, the second electrode is configured as a ground electrode, and the first and second electrodes are each comprised of an electrically-conductive material.

38. An apparatus according to claim 27, further comprising an external device in electrically-conductive engagement with the first conductive material through one of a conductive solder element, a conductive stud element, and a conductive bonding material therebetween.

39. An apparatus according to claim 36, further comprising an external device in electrically-conductive engagement with the second conductive material through one of a conductive solder element, a conductive stud element, and a conductive bonding material therebetween.

40. An apparatus according to claim 27, wherein the second via is configured to extend through the primary substrate toward the piezoelectric element.

\* \* \* \* \*

UNITED STATES PATENT AND TRADEMARK OFFICE
CERTIFICATE OF CORRECTION

| | | |
|---|---|---|
| PATENT NO. | : 8,692,441 B2 | Page 1 of 2 |
| APPLICATION NO. | : 13/907046 | |
| DATED | : April 8, 2014 | |
| INVENTOR(S) | : David Dausch and Scott H. Goodwin | |

It is certified that error appears in the above-identified patent and that said Letters Patent is hereby corrected as shown below:

In the Drawings

Delete Drawing Sheet 5 of 7 and substitute therefore with the attached Drawing Sheet 5 of 7 consisting of corrected FIG. 8.

Signed and Sealed this
Twentieth Day of January, 2015

Michelle K. Lee
*Deputy Director of the United States Patent and Trademark Office*